(12) United States Patent
Huang

(10) Patent No.: US 8,837,244 B2
(45) Date of Patent: Sep. 16, 2014

(54) MEMORY OUTPUT CIRCUIT

(75) Inventor: Shih-Huang Huang, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 233 days.

(21) Appl. No.: 13/176,858

(22) Filed: Jul. 6, 2011

(65) Prior Publication Data
US 2013/0010559 A1    Jan. 10, 2013

(51) Int. Cl.
*G11C 7/00* (2006.01)
*G11C 7/10* (2006.01)
*G11C 7/18* (2006.01)
*G11C 7/06* (2006.01)
*G11C 7/12* (2006.01)

(52) U.S. Cl.
CPC .............. *G11C 7/062* (2013.01); *G11C 7/1069* (2013.01); *G11C 7/18* (2013.01); *G11C 7/1048* (2013.01); *G11C 7/1057* (2013.01); *G11C 7/12* (2013.01)
USPC ........................................................ 365/203

(58) Field of Classification Search
USPC ........................................................ 365/203
See application file for complete search history.

(56) References Cited

U.S. PATENT DOCUMENTS

| | | | | |
|---|---|---|---|---|
| 5,870,344 | A   * | 2/1999 | Ozawa ........................... | 365/205 |
| 7,589,990 | B2  * | 9/2009 | Sung et al. .................... | 365/104 |
| 8,149,632 | B2  * | 4/2012 | Matsui ....................... | 365/189.05 |
| 2005/0030782 | A1  * | 2/2005 | Takahashi et al. ............ | 365/145 |
| 2006/0061405 | A1  * | 3/2006 | Zerbe ............................. | 327/336 |
| 2007/0097765 | A1  * | 5/2007 | Huang et al. .................. | 365/205 |
| 2008/0165601 | A1  * | 7/2008 | Matick et al. ................. | 365/202 |
| 2009/0010086 | A1  * | 1/2009 | Hong et al. .................... | 365/207 |
| 2011/0209109 | A1  * | 8/2011 | Wang et al. .................... | 716/106 |

* cited by examiner

*Primary Examiner* — Huan Hoang
*Assistant Examiner* — Min Huang
(74) *Attorney, Agent, or Firm* — McClure, Qualey & Rodack, LLP

(57) ABSTRACT

The invention provides a memory output circuit. The memory output circuit is capable of receiving bit line data and bit bar line data output by a memory cell array. In one embodiment, the memory output circuit comprises a pre-charge circuit, a pre-amplifier circuit, and a sense amplifier. The pre-charge circuit is capable of pre-charging a first node and a first inverse node wherein the bit line data and bit bar line data are respectively output to the first node and the first inverse node. The pre-amplifier circuit is capable of generating a second voltage on a second node and a second inverse voltage on a second inverse node according to a first voltage on the first node and a first inverse voltage on the first inverse node. The sense amplifier is capable of detecting the second voltage on the second node and the second inverse voltage on the second inverse node to generate a third voltage on a third node and a third inverse voltage on a third inverse node.

20 Claims, 6 Drawing Sheets

MEMORY OUTPUT CIRCUIT

BACKGROUND OF THE INVENTION

1. Field of the Invention

The invention relates to memories, and more particularly to memory output circuits.

2. Description of the Related Art

Referring to FIG. 1, a block diagram of at least a portion of a conventional memory circuit 100 is shown. The memory circuit 100 includes a memory cell array 120 and a memory output circuit 110. The memory cell array 120 includes a plurality of memory cells 121~12n. The memory cells 121~12n are read only memory (ROM) cells and are coupled between a bit line BL and a bit bar line BLB. Each of the memory cells 121~12n includes two NMOS transistors and is coupled to a word line. For example, the memory cell 121 is coupled to a word line $WL_1$ and includes two NMOS transistors 121a and 121b, and the memory cell 122 is coupled to a word line $WL_2$ and includes two NMOS transistors 122a and 122b. The gates of both two NMOS transistors of the memory cells 121~12n are coupled to the corresponding word lines, and the sources of both two NMOS transistors of the memory cells 121~12n are coupled to a ground voltage GND.

Each of the memory cells 121~12n stores a data bit which may have a bit value of "0" or "1". Only one NMOS transistor of the memory cells 121~12n has a drain coupled to the bit line BL or the bit bar line BLB. When a memory cell stores a bit value of "0", a connection between a drain of a right NMOS transistor of the memory cell and the bit bar line BLB is burned down with a laser when the memory cell is programmed. For example, when the memory cell 122 stores a bit value of "0", the drain of the NMOS transistor 122a is coupled to the bit line BL, and the drain of the NMOS transistor 122b is disconnected from the bit bar line BLB. When a memory cell stores a bit value of "1", a connection between a drain of a left NMOS transistor of the memory cell and the bit line BL is burned down with a laser when the memory cell is programmed. For example, when the memory cell 121 stores a bit value of "1", the drain of the NMOS transistor 121b is coupled to the bit bar line BLB, and the drain of the NMOS transistor 121a is disconnected from the bit line BL.

The conventional memory output circuit 110 includes a first pre-charge circuit 102, a second pre-charge circuit 106, and a Y-decoder circuit 104. Before data of the memory cell array 120 is output to the bit line BL and the bit bar line BLB, a first pre-charge signal PR triggers the first pre-charge circuit 102 to charge the bit line BL and the bit bar line BLB to a logic high voltage. Similarly, before data of the memory cell array 120 is output to the bit line BL and the bit bar line BLB, a second pre-charge signal PRB triggers the second pre-charge circuit 106 to charge a data line DL and a data bar line DLB to the logic high voltage.

A target memory cell selected from the memory cells 121~12n of the memory cell array 120 is then read. The word line corresponding to the target memory cell is selected to turn on the NMOS transistors of the target memory cell. If the target memory cell stores a bit value of "0", the left NMOS transistor couples the bit line BL to the ground voltage GND, lowering the voltage of the bit line BL to the ground voltage. If the target memory cell stores a bit value of "1", the right NMOS transistor couples the bit bar line BLB to the ground voltage GND, lowering the voltage of the bit bar line BLB to the ground voltage. A selection signal Y1 is then enabled to turn on the NMOS transistors 116 and 118 of the Y-decoder circuit 104. When the selection signal Y1 is enabled, the NMOS transistors 116 and 118 respectively couple the bit line BL and the bit bar line BLB to the data line DL and the data bar line DLB. The data value of the target memory cell is therefore output to the data line DL and the data bar line DLB.

The conventional memory output circuit 110, however, has a disadvantage of a low operation speed. To isolate the bit line BL and the bit bar line BLB from the data line DL and the data bar line DLB, the NMOS transistors 116 and 118 of the Y-decoder circuit 104 have a high threshold voltage $V_{TH}$. Because the NMOS transistors 116 and 118 have a high threshold voltage, the selection signal Y1 must be raised to a high level to turn on the NMOS transistors 116 and 118. Raising the voltage level of the selection signal Y1 requires a long time period of time, causing a delay in outputting of memory data and lowering the operation speed of the memory output circuit 100. To reduce the access time of a memory circuit, a memory output circuit with a high operation speed is therefore required.

BRIEF SUMMARY OF THE INVENTION

The invention provides a memory output circuit. The memory output circuit is capable of receiving bit line data and bit bar line data output by a memory cell array. In one embodiment, the memory output circuit includes a pre-charge circuit, a pre-amplifier circuit, and a sense amplifier. The pre-charge circuit is capable of pre-charging a first node and a first inverse node wherein the bit line data and bit bar line data are respectively output to the first node and the first inverse node. The pre-amplifier circuit is capable of generating a second voltage on a second node and a second inverse voltage on a second inverse node according to a first voltage on the first node and a first inverse voltage on the first inverse node. The sense amplifier is capable of detecting the second voltage on the second node and the second inverse voltage on the second inverse node to generate a third voltage on a third node and a third inverse voltage on a third inverse node.

The invention provides a memory output circuit. The memory output circuit is capable of receiving bit line data and bit bar line data output by a memory cell array. In one embodiment, the memory output circuit includes a pre-charge circuit, a source follower circuit, and a half latch circuit. The pre-charge circuit is coupled between a first voltage terminal, a first node, and a first inverse node, and is capable of pre-charging the first node and the first inverse node wherein the bit line data and bit bar line data are respectively output to the first node and the first inverse node. The source follower circuit is coupled between the first node, the first inverse node, the second node, and the second inverse node, and is capable of receiving a first voltage on the first node and a first inverse voltage on the first inverse node. The half latch circuit is coupled between the first voltage terminal, the second node, and the second inverse node, and is capable of generating a second voltage on the second node and a second inverse voltage on the second inverse node according to the first voltage and the first inverse voltage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a memory circuit comprising a memory cell array and a memory output circuit. A bit line and a bit bar line are coupled between the memory cell array and the memory output circuit. When the memory cell array is accessed, the memory cell array outputs accessed data stored therein to the bit line and the bit bar line, and the memory output circuit then detects the voltages on the bit line and the bit bar line to generate output data. The memory cell array includes a plurality of memory cells coupled between the bit line and the bit bar line. At least one memory cell stores a data bit. The memory cells may be static random access memory (SRAM) cells, read only memory (ROM) cells or any other memory cells.

Figure 1:
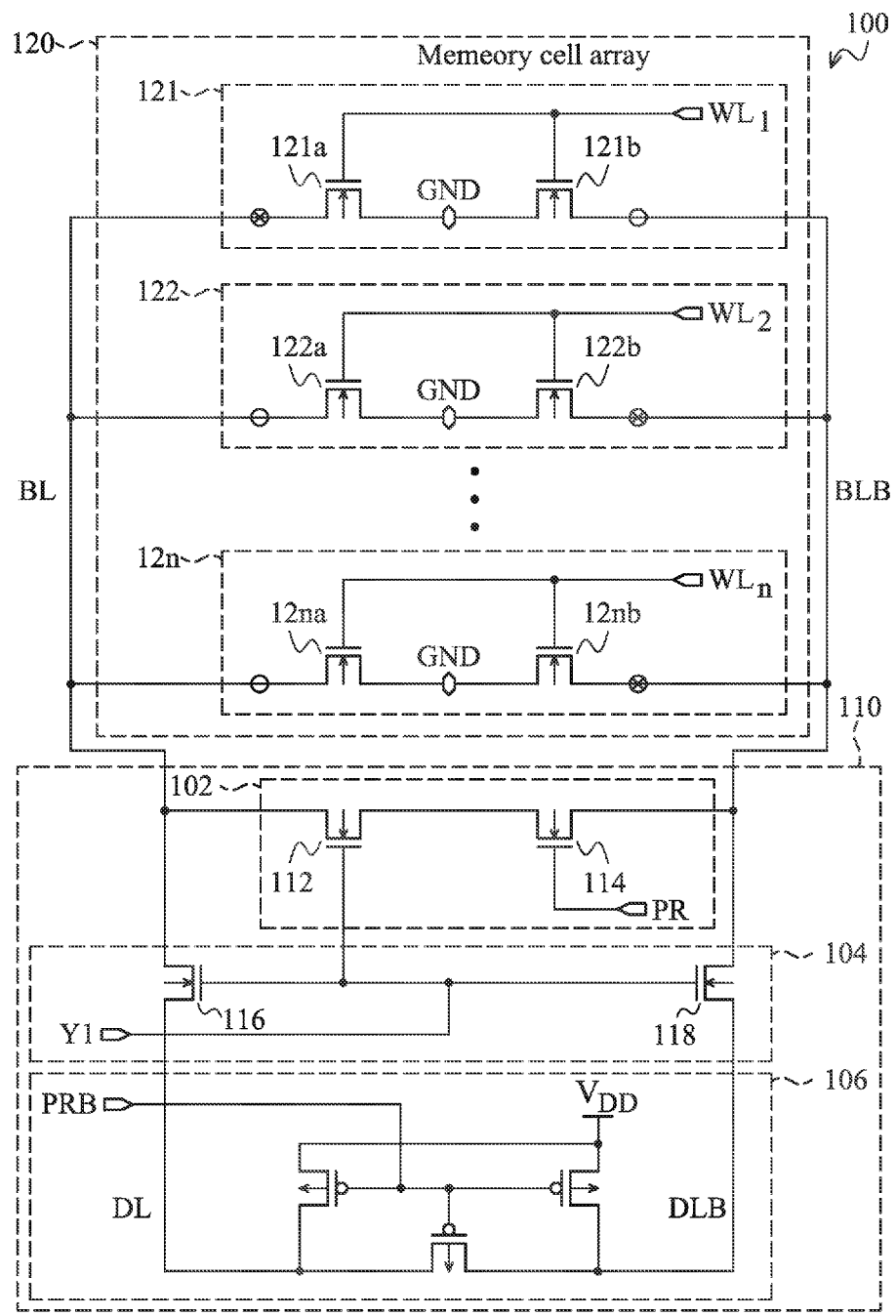
FIG. 1 is a block diagram of at least a portion of a conventional memory circuit.
Figure 2A:
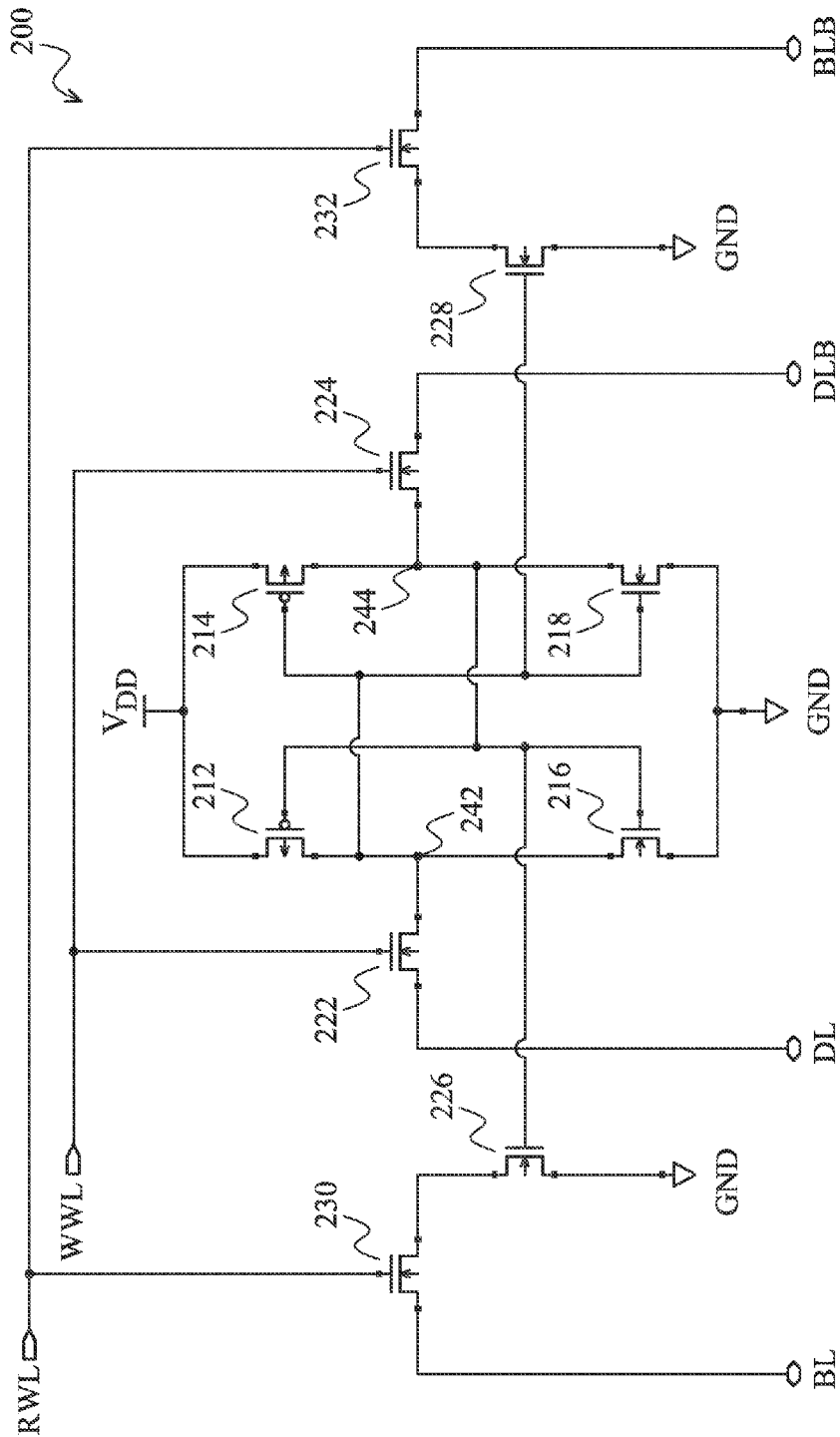
FIG. 2A is a circuit diagram of a static random access memory (SRAM) cell according to the invention.

Referring to FIG. 2A, a circuit diagram of a static random access memory (SRAM) cell 200 according to the invention is shown. The SRAM cell 200 includes two PMOS transistors 212 and 214 and a plurality of NMOS transistors 216~232. A core circuit of the memory cell 200 includes the PMOS transistors 212, 214 and the NMOS transistors 216, 218 and stores a data bit. The PMOS transistor 212 is coupled between a first voltage terminal such as $V_{DD}$ and a node 242, and the PMOS transistor 214 is coupled between the first voltage terminal such as $V_{DD}$ and a node 244. The NMOS transistor 216 is coupled between the node 242 and a second voltage terminal such as GND, and the NMOS transistor 218 is coupled between the node 244 and the second voltage terminal such as GND. Both the gates of the PMOS transistor 212 and the NMOS transistor 216 are coupled to the node 244, and both the gates of the PMOS transistor 214 and the NMOS transistor 218 are coupled to the node 242.

When a data bit 0 is to be stored to the memory cell 200, a data line DL can have a logic low voltage, and a data bar line DLB can have a logic high voltage. A write word line WWL can then be enabled to turn on the NMOS transistors 222 and 224, respectively coupling the data line DL and the data bar line DLB to the nodes 242 and 244. The voltage of the node 242 is therefore lowered toward a logic low voltage of the data line DL, and the voltage of the node 244 is raised toward a logic high voltage of the data bar line DLB. When a data bit 1 is to be stored to the memory cell 200, the data line DL can have a logic high voltage, and the data bar line DLB can have a logic low voltage. The write word line WWL can then be enabled to turn on the NMOS transistors 222 and 224, respectively coupling the data line DL and the data bar line DLB to the nodes 242 and 244. The voltage of the node 242 is therefore raised toward a logic high voltage of the data line DL, and the voltage of the node 244 is lowered toward a logic low voltage of the data bar line DLB.

When the memory cell 200 is to be read, a read word line RWL can be enabled to turn on the NMOS transistors 230 and 232. A bit line BL is therefore coupled to a drain of the NMOS transistor 226, and a bit bar line BLB is therefore coupled to a drain of the NMOS transistor 228. If the memory cell 200 stores a data bit of "0", the node 242 has a logic low voltage, and the node 244 has a logic high voltage. The NMOS transistor 226 is therefore turned on, the bit line BL at the drain of the NMOS transistor 226 is coupled to the second voltage terminal GND at the source of the NMOS transistor 226, and the voltage of the bit line BL is lowered toward the second voltage terminal GND. On the contrary, the NMOS transistor 228 is therefore turned off, and the voltage of the bit bar line BLB is not lowered. If the memory cell 200 stores a data bit of "1", the node 242 has a logic high voltage, and the node 244 has a logic low voltage. The NMOS transistor 228 is therefore turned on, the bit bar line BLB at the drain of the NMOS transistor 228 is coupled to the second voltage terminal GND at the source of the NMOS transistor 228, and the voltage of the bit bar line BLB is lowered toward the second voltage terminal GND. On the contrary, the NMOS transistor 226 is therefore turned off, and the voltage of the bit line BL is not lowered.

Figure 2B:
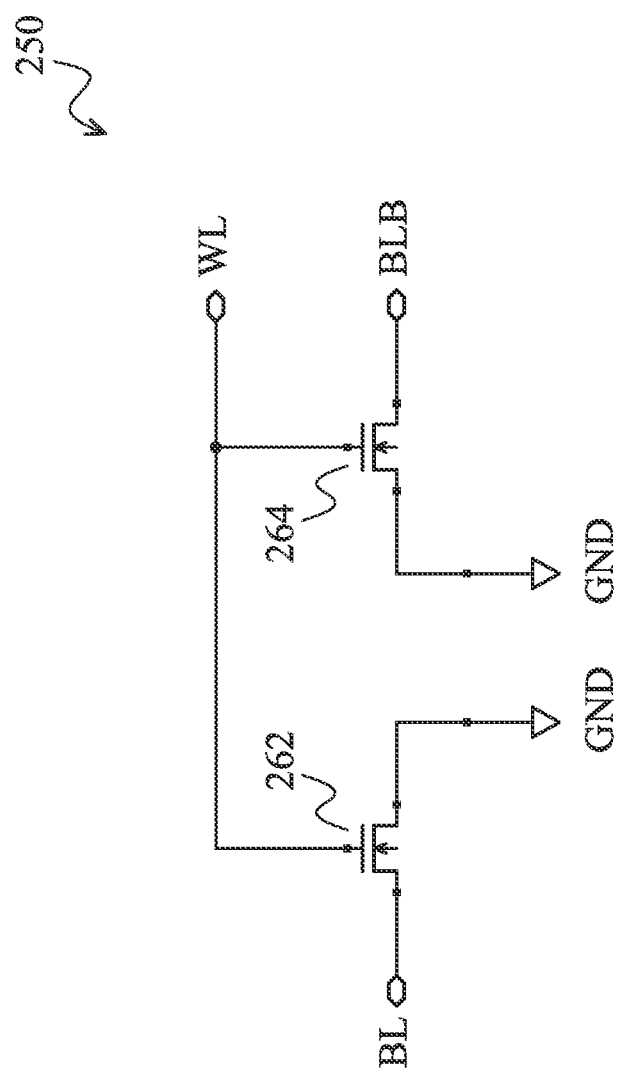
FIG. 2B is a circuit diagram of a read only memory (ROM) cell according to the invention.

Referring to FIG. 2B, a circuit diagram of a read only memory (ROM) cell 250 according to the invention is shown. The ROM cell 250 includes two NMOS transistors 262 and 264. The sources of both the NMOS transistors 262 and 264 are coupled to a second voltage terminal such as GND. The gates of both the NMOS transistors 262 and 264 are coupled to a word line WL. When the memory cell 250 is to be read, the word line WL can be enabled to turn on the NMOS transistors 262 and 264. If the memory cell 250 stores a bit "0", the drain of the NMOS transistor 262 can be coupled to a bit line BL, and the drain of the NMOS transistor 264 can be not coupled to a bit bar line BLB. The bit line at the drain of the NMOS transistor 262 is therefore coupled to the second voltage terminal such as GND at the source of the NMOS transistor 262, and the voltage of the bit line BL is lowered toward the second voltage terminal GND. On the contrary, the voltage of the bit bar line BLB is not lowered. If the memory cell 250 stores a bit "1", the drain of the NMOS transistor 264 can be coupled to the bit bar line BLB, and the drain of the NMOS transistor 262 can be not coupled to the bit line BL. The bit bar line at the drain of the NMOS transistor 264 is therefore coupled to the second voltage terminal such as GND at the source of the NMOS transistor 264, and the voltage of the bit bar line BLB is lowered toward the second voltage terminal such as GND. On the contrary, the voltage of the bit line BL is not lowered.

Figure 3:
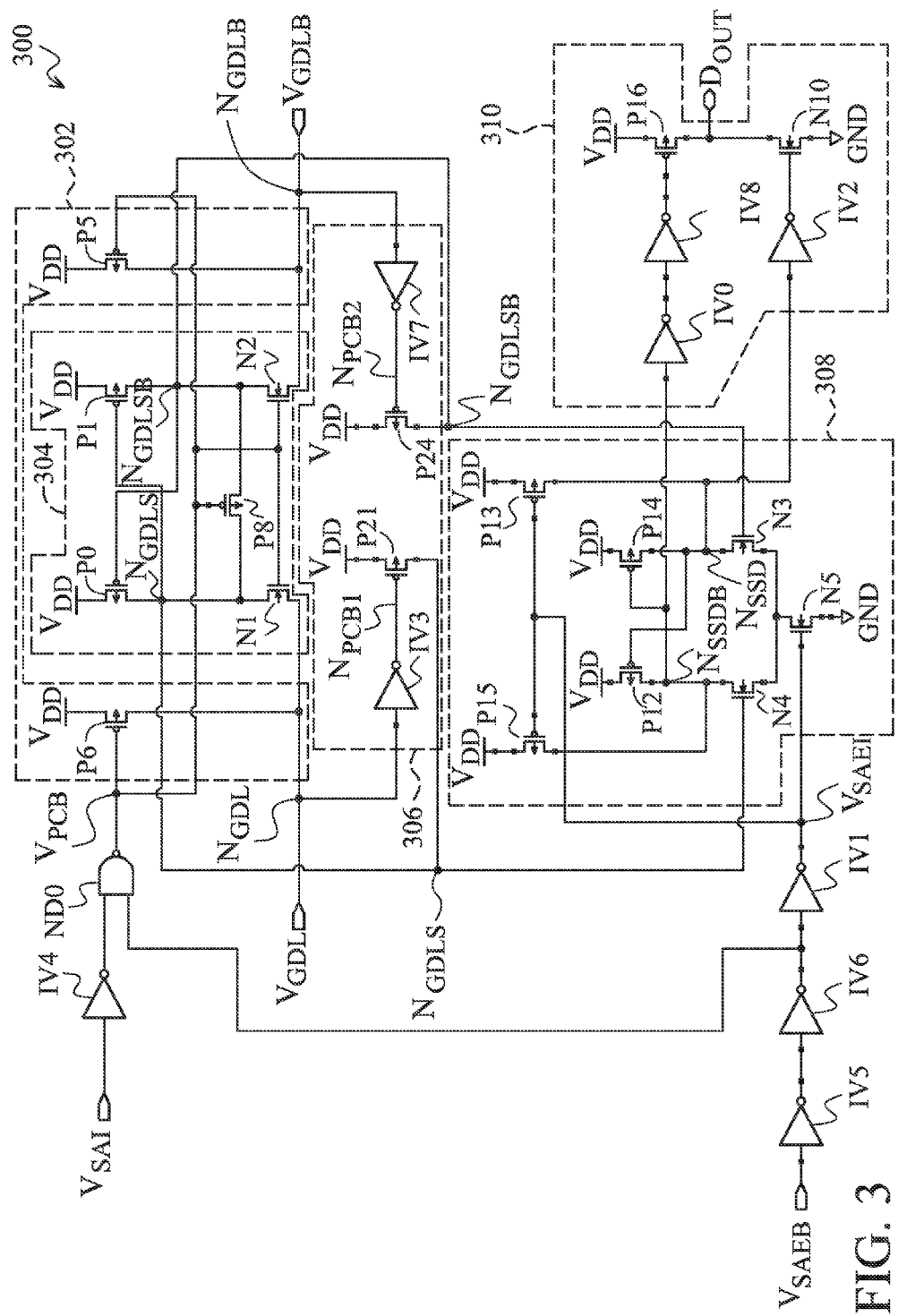
FIG. 3 is a circuit diagram of a memory output circuit according to the invention.

Referring to FIG. 3, a circuit diagram of a memory output circuit 300 according to the invention is shown. In one embodiment, the memory output circuit 300 includes a pre-charge circuit 302, a pre-amplifier circuit 304, a dynamic loading circuit 306, a sense amplifier 308, and an output stage circuit 310. The memory output circuit 300 has two input terminals $N_{GDL}$ and $N_{GDLB}$ respectively coupled to a bit line and a bit bar line to receive data output by a memory cell array. In this embodiment, before memory data on the bit line and the bit bar line is transmitted to the input terminals $N_{GDL}$ and $N_{GDLB}$, a pre-charge signal $V_{PCB}$ may trigger the pre-charge circuit 302 to pre-charge the voltages of the first node $N_{GDL}$ and the first inverse node $N_{GDLB}$ to a logic high level. In other embodiments, according to different designs of memory cell array and/or memory output circuit, the voltages of the first node $N_{GDL}$ and the first inverse node $N_{GDLB}$ can be pre-charged to a logic low level or any other voltage level. After the memory data on the bit line and the bit bar line is transmitted to the first node $N_{GDL}$ and the first inverse node $N_{GDLB}$, the pre-amplifier circuit 304 may amplify the voltages on the first node $N_{GDL}$ and the first inverse node $N_{GDLB}$ to generate a second voltage on a second node $N_{GDLS}$ and a second inverse voltage on a second inverse node $N_{GDLSB}$. A sense enable signal $V_{SAEI}$ may then trigger the sense amplifier 308 to detect the second voltage on the second node $N_{GDLS}$ and the second inverse voltage on the second inverse node $N_{GDLSB}$ to generate a third voltage on a third node $N_{SSD}$ and a third inverse voltage on a third inverse node $N_{SSDB}$. The output stage circuit 310 may then generate an output voltage $D_{OUT}$ on an output node according to the third voltage on the third node $N_{SSD}$ and the third inverse voltage on the third inverse node $N_{SSDB}$.

The memory output circuit 300 has two control signals $V_{SAI}$ and $V_{SAEB}$. An inverter IV4 is capable of inverting the control signal $V_{SAI}$ to generate a first input signal of a NAND gate ND0. Two inverters IV5 and IV6 are capable of delaying the control signal $V_{SAEB}$ to generate a second input signal of the NAND gate ND0. In this embodiment, before data of a memory cell array is output to the bit line and the bit bar line, the two input signals of the NAND gate ND0 may both be at a logic high level, and the NAND gate ND0 may then generate the pre-charge signal $V_{PCB}$ of a logic low level. The pre-charge signal $V_{PCB}$ may therefore trigger the pre-charge circuit 302 to pre-charge the first node $N_{GDL}$ and the first inverse node $N_{GDLB}$ to a logic high voltage. In other embodiments, according to different designs of memory cell array and/or memory output circuit, the voltages of the first node $N_{GDL}$ and the first inverse node $N_{GDLB}$ can be pre-charged to a logic low level or any other voltage level. In one embodiment, the pre-charge circuit 302 includes two PMOS transistors P6 and P5. The PMOS transistor P6 is coupled between a first voltage terminal such as $V_{DD}$ and the first node $N_{GDL}$, and the gate of the PMOS transistor P6 is coupled to the pre-charge signal $V_{PCB}$. The PMOS transistor P5 is coupled between the first voltage terminal such as $V_{DD}$ and the first inverse node $N_{GDLB}$, and the gate of the PMOS transistor P5 is coupled to the pre-charge signal $V_{PCB}$.

The memory output circuit 300 can be coupled to the bit line and the bit bar line via two transmission gate transistors. A first transmission gate transistor is coupled between the bit line and the first node $N_{GDL}$, and a second transmission gate transistor is coupled between the bit bar line and the first inverse node $N_{GDLB}$. When a target cell of a memory cell array is read, the data bit of the target cell is output to the bit line and the bit bar line. If the target cell stores a data bit "0", the voltage of the bit line is lowered toward a second voltage terminal such as ground voltage. If the target cell stores a data bit "1", the voltage of the bit bar line is lowered toward the second voltage terminal such as ground voltage. The two transmission gate transistors are then turned on to respectively couple the bit line and the bit bar line to the first node $N_{GDL}$ and the first inverse node $N_{GDLB}$, resulting in a first voltage on the first node $N_{GDL}$ and a first inverse voltage on the first inverse node $N_{GDLB}$. When the bit line and the bit bar line are respectively coupled to the first node $N_{GDL}$ and the first inverse node $N_{GDLB}$, the pre-charge signal $V_{PCB}$ can be disabled to turn off the PMOS transistors P5 and P6 of the pre-charge circuit 302 and the PMOS transistor P8 of the pre-amplifier circuit 304. If the target cell stores a data bit "0", the first voltage on the first node $N_{GDL}$ is lowered to a logic low level. If the target cell stores a data bit "1", the first inverse voltage on the first inverse node $N_{GDLB}$ is lowered to the logic low level.

The pre-amplifier circuit 304 can then amplify the first voltage on the first node $N_{GDL}$ and the first inverse voltage on the first inverse node $N_{GDLB}$ to generate a second voltage on the second node $N_{GDLS}$ and a second inverse voltage on the second inverse node $N_{GDLSB}$. In one embodiment, the pre-amplifier circuit 304 includes a source follower circuit, a half latch circuit, and a PMOS transistor P8. The source follower circuit includes two NMOS transistors N1 and N2. The NMOS transistor N1 is coupled between the second node $N_{GDLS}$ and the first node $N_{GDL}$, and the gate of the NMOS transistor N1 is coupled to the pre-charge signal $V_{PCB}$. The NMOS transistor N2 is coupled between the second inverse node $N_{GDLSB}$ and the first inverse node $N_{GDLB}$, and the gate of the NMOS transistor N2 is also coupled to the pre-charge signal $V_{PCB}$. The pre-charge signal $V_{PCB}$ can be disabled to enable the NMOS transistors N1 and N2 to respectively deliver the voltages of the first node $N_{GDL}$ and the first inverse node $N_{GDLB}$ to the second node $N_{GDLS}$ and the second inverse node $N_{GDLSB}$. If the first voltage on the first node $N_{GDL}$ is lowered to a logic low level, the NMOS transistor N1 lowers the second voltage on the second node $N_{GDLS}$ toward the logic low level. If the first inverse voltage on the first inverse node $N_{GDLB}$ is lowered to the logic low level, the NMOS transistor N2 lowers the second inverse voltage on the second inverse node $N_{GDLSB}$ toward the logic low level. The PMOS transistor P8 couples the drain of the NMOS transistor N1 with the drain of the NMOS transistor N2 when the output voltage $V_{PCB}$ of the NAND gate ND0 triggers the pre-charge operation of the pre-charge circuit 302.

The half latch circuit of the pre-amplifier circuit 304 includes two PMOS transistors P0 and P1. The PMOS transistor P0 is coupled between a first voltage terminal such as $V_{DD}$ and the second node $N_{GDLS}$, and the gate of the PMOS transistor P0 is coupled to the second inverse node $N_{GDLSB}$. The PMOS transistor P1 is coupled between the first voltage terminal such as $V_{DD}$ and the second inverse node $N_{GDLSB}$, and the gate of the PMOS transistor P1 is coupled to the second node $N_{GDLS}$. If the second voltage on the second node $N_{GDLS}$ is lowered to a logic low level, the PMOS transistor P1 is turned on to raise the second inverse voltage on the second inverse node $N_{GDLSB}$ to a logic high level. If the second inverse voltage on the second inverse node $N_{GDLSB}$ is lowered to a logic low level, the PMOS transistor P0 is turned on to raise the second voltage on the second node $N_{GDLS}$ to the logic high level.

The dynamic loading circuit 306 charges the second node $N_{GDLS}$ to the logic high voltage when the first voltage on the first node $N_{GDL}$ is greater than a threshold voltage of the PMOS transistor P21, and charges the second inverse node $N_{GDLSB}$ to the logic high voltage when the first inverse voltage on the first inverse node $N_{GDLB}$ is greater than the threshold voltage of the PMOS transistor P24. In one embodiment, the dynamic loading circuit 306 includes two inverters IV3, IV7 and two PMOS transistors P21, P24. The inverter IV3 is coupled between the first node $N_{GDL}$ and the gate of the PMOS transistor P21. The PMOS transistor P21 is coupled between the first voltage terminal such as $V_{DD}$ and the second node $N_{GDLS}$. The inverter IV7 is coupled between the first inverse node $N_{GDLB}$ and the gate of the PMOS transistor P24. The PMOS transistor P24 is coupled between the first voltage terminal such as $V_{DD}$ and the second inverse node $N_{GDLSB}$. If the first voltage on the first node $N_{GL}$ is raised to a logic high level, the inverter IV3 is capable of inverting the first voltage to generate a logic low voltage at the gate of the PMOS transistor P21, and the PMOS transistor P21 is turned on to raise the second voltage on the second node $N_{GDLS}$ toward the logic high level. If the first inverse voltage on the first inverse node $N_{GDLB}$ is raised to a logic high level, the inverter IV7 is capable of inverting the first inverse voltage to generate a logic low voltage at the gate of the PMOS transistor P24, and the PMOS transistor P24 is turned on to raise the second inverse voltage on the second inverse node $N_{GDLSB}$ toward the logic high level.

The sense amplifier 308 is capable of detecting the second voltage on the second node $N_{GDLS}$ and the second inverse voltage on the second inverse node $N_{GDLSB}$ to generate a third voltage on a third node $N_{SSD}$ and a third inverse voltage on a third inverse node $N_{SSDB}$. A sense enable signal $V_{SAEI}$ is capable of enabling operation of the sense amplifier 308. If the second voltage on the second node $N_{GDLS}$ is at a logic low level and the second inverse voltage on the second inverse node $N_{GDLSB}$ is at a logic high level, the sense amplifier 308 is capable of generating a third voltage of a logic low level on the third node $N_{SSD}$, and generating a third inverse voltage of a logic high level on the third inverse node $N_{SSDB}$. If the second voltage on the second node $N_{GDLS}$ is at a logic high level and the second inverse voltage on the second inverse node $N_{GDLSB}$ is at a logic low level, the sense amplifier 308 generates a third voltage of a logic high level on the third node $N_{SSD}$, and generates a third inverse voltage of a logic low level on the third inverse node $N_{SSDB}$.

In one embodiment, the sense amplifier 308 includes four PMOS transistors P12, P13, P14, P15 and three NMOS transistors N3, N4, N5. The NMOS transistor N5 has a gate coupled to the sense enable signal $V_{SAEI}$ and a source coupled to a second voltage terminal such as GND. The NMOS transistor N4 is coupled between the third inverse node $N_{SSDB}$ and the drain of the NMOS transistor N5, and the gate of the NMOS transistor N4 is coupled to the second node $N_{GDLS}$. The NMOS transistor N3 is coupled between the third node $N_{SSD}$ and the drain of the NMOS transistor N5, and the gate of the NMOS transistor N3 is coupled to the second inverse node $N_{GDLSB}$. The PMOS transistors P12 is coupled between the first voltage terminal such as $V_{DD}$ and the third inverse node $N_{SSDB}$, and the gate of the PMOS transistor P12 is coupled to the third node $N_{SSD}$. The PMOS transistors P14 is coupled between the first voltage terminal such as $V_{DD}$ and the third node $N_{SSD}$, and the gate of the PMOS transistor P14 is coupled to the third inverse node $N_{SSDB}$. The PMOS transistor P15 is coupled between the first voltage terminal such as $V_{DD}$ and the third inverse node $N_{SSDB}$, the PMOS transistor P13 is coupled between the first voltage terminal such as $V_{DD}$ and the third node $N_{SSD}$, and the gates of both the PMOS transistors P13 and P15 are coupled to the sense enable signal $V_{SAEI}$.

When the sense enable signal $V_{SAEI}$ is disabled, the PMOS transistors P13 and P15 are turned on to charge the voltages of the third node $N_{SSD}$ and the third inverse node $N_{SSDB}$ to a logic high level. When the sense enable signal $V_{SAEI}$ is enabled, the PMOS transistors P13 and P15 are turned off, and the NMOS transistor N5 is turned on to lower the voltage of the sources of the NMOS transistors N3 and N4 to a logic low level. When the second voltage on the second node $N_{GDLS}$ is at a logic high level, the NMOS transistor N4 is turned on to lower the third inverse voltage on the third inverse node $N_{SSDB}$ to a logic low level, and the PMOS transistor P14 is further turned on to raise the third voltage on the third node $N_{SSD}$ to a logic high level. When the second inverse voltage on the second inverse node $N_{GDLSB}$ is at a logic high level, the NMOS transistor N3 is turned on to lower the third voltage on the third node $N_{SSD}$ to a logic low level, and the PMOS transistor P12 is further turned on to raise the third inverse voltage on the third inverse node $N_{SSDB}$ to a logic high level.

The output stage circuit 310 then generates an output voltage $D_{OUT}$ according to the third voltage on the third node $N_{SSD}$ and the third inverse voltage on the third inverse node $N_{SSDB}$. In one embodiment, the output stage circuit 310 includes three inverters IV0, IV8, IV2, a PMOS transistor P16, and an NMOS transistor N10. The inverters IV0 and IV8 are connected in series between the third inverse node $N_{SSDB}$ and the gate of the PMOS transistor P16. The inverter IV2 is connected between the third node $N_{SSD}$ and the gate of the NMOS transistor N10. The PMOS transistor P16 is coupled between the first voltage terminal such as $V_{DD}$ and the output node, and the NMOS transistor N10 is coupled between the output node and the second voltage terminal such as GND. When the third voltage is at a logic high level and the third inverse voltage is at a logic low level, the PMOS transistor P16 is turned on to generate the output voltage $D_{OUT}$ with a logic high level. When the third voltage is at a logic low level and the third inverse voltage is at a logic high level, the NMOS transistor N10 is turned on to generate the output voltage $D_{OUT}$ with a logic low level.

Figure 4:
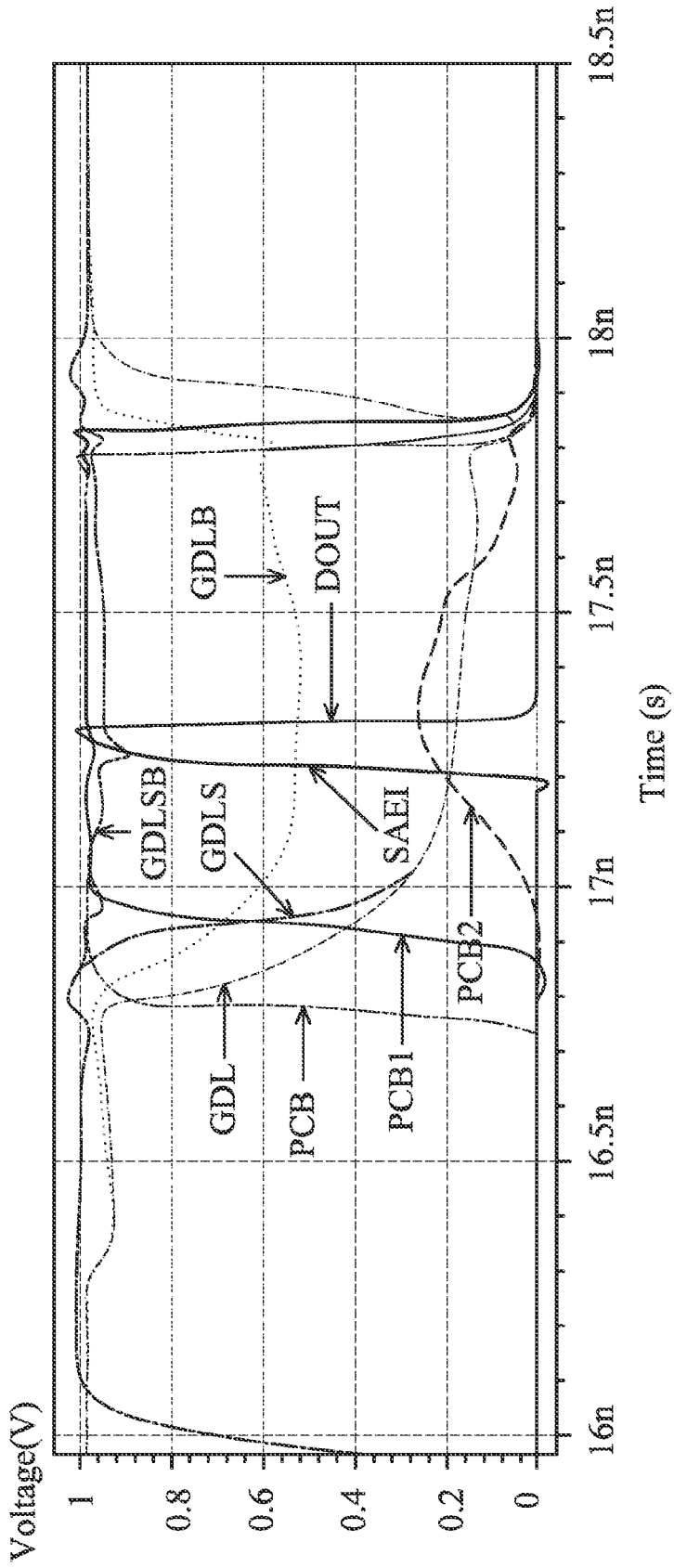
FIG. 4 is a schematic diagram of a first embodiment of voltage transition of the memory output circuit shown in FIG. 3 according to the invention.

Referring to FIG. 4, a schematic diagram of a first embodiment of voltage transition of the memory output circuit 300 according to the invention is shown. Before data of a memory cell array is accessed, a pre-charge voltage PCB is at a logic low level to trigger the pre-charge circuit 302 to charge the first node $N_{GDL}$ and the first inverse node $N_{GDLB}$. Data of the memory cell array is then output to a bit line and a bit bar line. Before the bit line and the bit bar line are respectively coupled to the first node $N_{GDL}$ and the first inverse node $N_{GDLB}$, the pre-charge voltage PCB is raised to a logic high level to disable the pre-charge circuit 302. Assume that the memory cell array outputs a data bit with a value "0". The bit line then lowers the first voltage GDL on the first node $N_{GDL}$ to a logic low level, and the bit bar line does not lower the first inverse voltage GDLB on the first inverse node $N_{GDLB}$. The pre-amplifier circuit 304 and the dynamic loading circuit 306 are capable of then cooperating to generate a second voltage GDLS with a logic low level on the second node $N_{GDLS}$ and a second inverse voltage GDLSB with a logic high level on the second inverse node $N_{GDLSB}$. The sense enable signal SAEI is then raised to a logic high level, and the sense amplifier 308 is capable of then generating a third voltage with a logic low level on the third node $N_{SSD}$ and a third inverse voltage with a logic high level on the third inverse node $N_{SSDB}$. The output stage circuit 310 is capable of then generating an output voltage DOUT with a logic low level at the output node.

Figure 5:
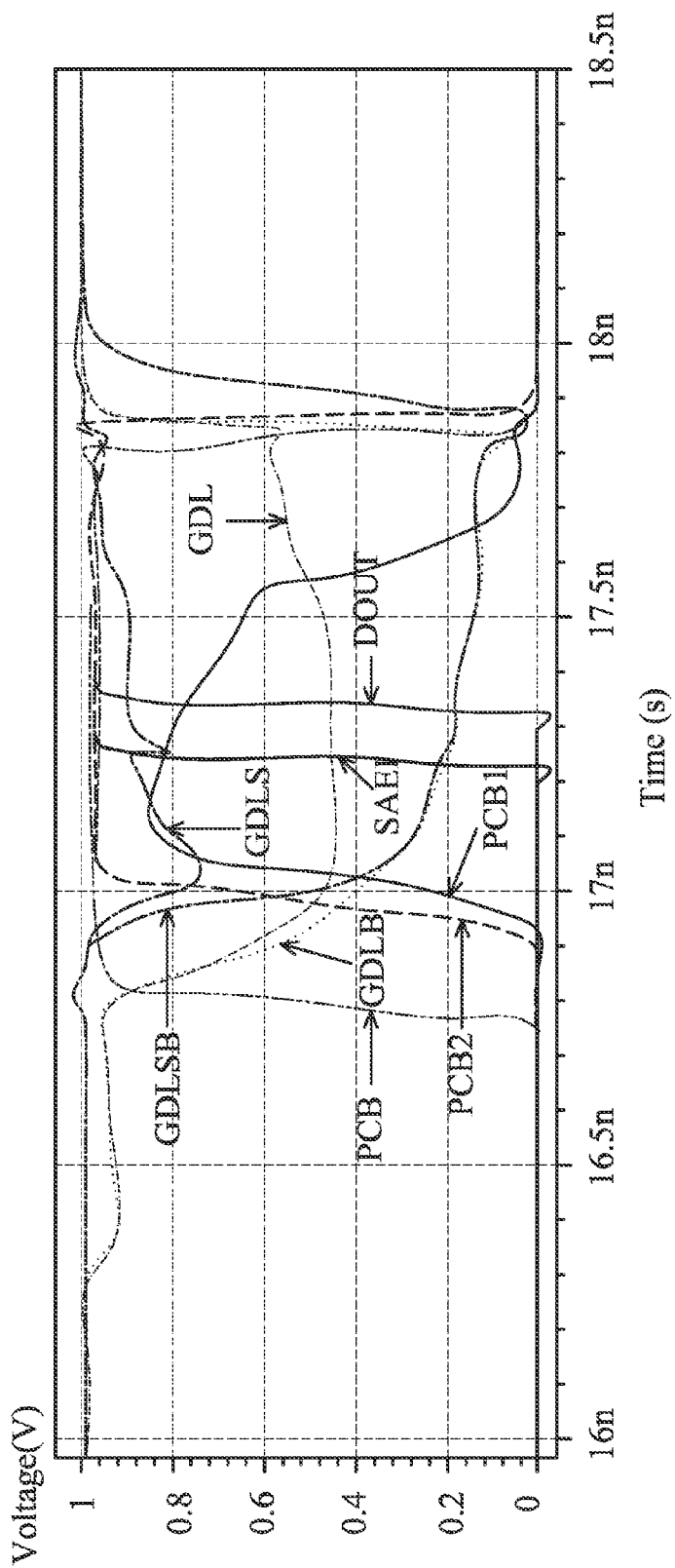
FIG. 5 is a schematic diagram of a second embodiment of voltage transition of the memory output circuit shown in FIG. 3 according to the invention.

Referring to FIG. 5, a schematic diagram of a second embodiment of voltage transition of the memory output circuit 300 according to the invention is shown. Before data of a memory cell array is accessed, a pre-charge voltage PCB is at a logic low level to trigger the pre-charge circuit 302 to charge the first node $N_{GDL}$ and the first inverse node $N_{GDLB}$. Data of the memory cell array is then output to a bit line and a bit bar line. Before the bit line and the bit bar line are respectively coupled to the first node $N_{GDL}$ and the first inverse node $N_{GDLB}$, the pre-charge voltage PCB is raised to a logic high level to disable the pre-charge circuit 302. Assume that the memory cell array outputs a data bit with a value "1". The bit bar line then lowers the first inverse voltage GDLB on the first inverse node $N_{GDLB}$ to a logic low level, and the bit line does not lower the first voltage GDL on the first node $N_{GDL}$. The pre-amplifier circuit 304 and the dynamic loading circuit 306 are capable of then cooperating to generate a second inverse voltage GDLSB with a logic low level on the second inverse node $N_{GDLSB}$ and a second voltage GDLS with a logic high level on the second node $N_{GDLS}$. The sense enable signal SAEI is then raised to a logic high level, and the sense amplifier 308 is capable of generating a third inverse voltage with a logic low level on the third inverse node $N_{SSDB}$ and a third voltage with a logic high level on the third node $N_{SSD}$. The output stage circuit 310 is capable of generating an output voltage DOUT with a logic high level at the output node.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory output circuit, capable of receiving bit line data and bit bar line data output by a memory cell array, comprising:
    a pre-charge circuit, capable of pre-charging a first node and a first inverse node, wherein the bit line data and bit bar line data are respectively output to the first node and the first inverse node;
    a pre-amplifier circuit, capable of respectively generating a second voltage on a second node and a second inverse voltage on a second inverse node according to a first voltage on the first node and a first inverse voltage on the first inverse node; and
    a sense amplifier, capable of receiving a sense enable signal, and detecting the second voltage on the second node and the second inverse voltage on the second inverse node to generate a third voltage on a third node and a third inverse voltage on a third inverse node according to the sense enable signal,
    wherein the pre-amplifier circuit comprises:
        a source follower circuit, capable of receiving the first voltage on the first node and the first inverse voltage on the first inverse node according to an output trigger voltage; and
        a half latch circuit, capable of generating the second voltage on the second node and the second inverse voltage on the second inverse node according to the first voltage and the first inverse voltage.

2. The memory output circuit as claimed in claim 1, wherein the output trigger voltage is set to a logic low voltage before the bit line data and the bit bar line data are output to the first node and the first inverse node and is raised to a logic high voltage when the bit line data and the bit bar line data are output to the first node and the first inverse node.

3. The memory output circuit as claimed in claim 2, wherein the pre-charge circuit comprises:
    a first PMOS transistor, coupled between a first voltage terminal and the first node, having a gate coupled to the output trigger voltage; and
    a second PMOS transistor, coupled between the first voltage terminal and the first inverse node, having a gate coupled to the output trigger voltage.

4. The memory output circuit as claimed in claim 1, wherein the source follower circuit comprises:
    a first NMOS transistor, coupled between the first node and the second node, having a gate coupled to the output trigger voltage;
    a second NMOS transistor, coupled between the first inverse node and the second inverse node, having a gate coupled to the output trigger voltage; and
    a PMOS transistor, coupled between the second inverse node and the second node, having a gate coupled to the output trigger voltage.

5. The memory output circuit as claimed in claim 1, wherein the half latch circuit comprises:
    a first PMOS transistor, coupled between a first voltage terminal and the second node, having a gate coupled to the second inverse node; and
    a second PMOS transistor, coupled between the first voltage terminal and the second inverse node, having a gate coupled to the second node.

6. The memory output circuit as claimed in claim 1, wherein the memory output circuit further comprises a dynamic loading circuit, capable of charging the second node to a logic high voltage when the first voltage on the first node is greater than a threshold voltage, and charging the second inverse node to the logic high voltage when the first inverse voltage on the first inverse node is greater than the threshold voltage.

7. The memory output circuit as claimed in claim 6, wherein the dynamic loading circuit comprises:
    a first PMOS, coupled between a first voltage terminal and the second node, having a gate coupled to a first inverting voltage; and
    a second PMOS, coupled between the first voltage terminal and the second inverse node, having a gate coupled to a second inverting voltage;
    wherein the first inverting voltage is obtained by inverting the first voltage, and the second inverting voltage is obtained by inverting the first inverse voltage.

8. The memory output circuit as claimed in claim 1, wherein the sense amplifier circuit comprises:
    a first NMOS transistor, having a gate coupled to the sense enable signal, and a source coupled to a second voltage terminal;
    a second NMOS transistor, coupled between the third inverse node and the drain of the first NMOS transistor, having a gate coupled to the second node;
    a third NMOS transistor, coupled between the third node and the drain of the first NMOS transistor, having a gate coupled to the second inverse node;
    a first PMOS transistor, coupled between a first voltage terminal and the third inverse node, having a gate coupled to the third node;
    a second PMOS transistor, coupled between the first voltage terminal and the third node, having a gate coupled to the third inverse node;
    a third PMOS transistor, coupled between the first voltage terminal and the third inverse node, having a gate coupled to the sense enable signal; and
    a fourth PMOS transistor, coupled between the first voltage terminal and the third node, having a gate coupled to the sense enable signal.

9. The memory output circuit as claimed in claim 1, wherein the memory output circuit further comprises an output stage circuit, capable of generating an output voltage on an output node according to the third voltage on the third node and the third inverse voltage on the third inverse node.

10. The memory output circuit as claimed in claim 9, wherein the output stage circuit comprises:
    a first inverter, having an input terminal coupled to the third inverse node;
    a second inverter, having an input terminal coupled to the output terminal of the first inverter;
    a third inverter, having an input terminal coupled to the third node;
    a PMOS transistor, coupled between a first voltage terminal and the output node, having a gate coupled to the output terminal of the second inverter; and
    an NMOS transistor, coupled between the output node and a second voltage terminal, having a gate coupled to the output terminal of the third inverter.

11. The memory output circuit as claimed in claim 1, wherein the memory cell array outputs the bit line data and the bit bar line data to a bit line and a bit bar line, and the memory output circuit further comprises:
- a first transmission gate transistor, coupled between the bit line and the first node, capable of coupling the bit line with the first node to transmit the bit line data to the first node; and
- a second transmission gate transistor, coupled between the bit bar line and the first inverse node, capable of coupling the bit bar line with the first inverse node to transmit the bit bar line data to the first inverse node.

12. The memory output circuit as claimed in claim 1, wherein the memory cell array comprises a plurality of read only memory (ROM) cells coupled between a bit line and a bit bar line, and at least one of the ROM cell comprises:
- a first NMOS transistor, having a drain coupled to a second voltage terminal, and a gate coupled to a word line; and
- a second NMOS transistor, having a drain coupled to the second voltage terminal, and a gate coupled to the word line,
- wherein the source of the first NMOS transistor is coupled to the bit line when the source of the second NMOS transistor is not coupled to the bit bar line, and the source of the second NMOS transistor is coupled to the bit bar line when the source of the first NMOS transistor is not coupled to the bit line.

13. The memory output circuit as claimed in claim 11, wherein the memory cell array comprises a plurality of static random access memory (SRAM) cells coupled between the bit line and the bit bar line, and at least one of the SRAM cell comprises:
- a first PMOS transistor, coupled between a first voltage terminal and a fourth node, having a gate coupled to a fifth node;
- a second PMOS transistor, coupled between the first voltage terminal and the fifth node, having a gate coupled to the fourth node;
- a first NMOS transistor, coupled between the fourth node and a second voltage terminal, having a gate coupled to the fifth node;
- a second NMOS transistor, coupled between the fifth node and the second voltage terminal, having a gate coupled to the fourth node;
- a third NMOS transistor, having a gate coupled to the fifth node, and a source coupled to the second voltage terminal;
- a fourth NMOS transistor, coupled between the drain of the third NMOS transistor and the bit line, having a gate coupled to a word line;
- a fifth NMOS transistor, having a gate coupled to the fourth node, and a source coupled to the second voltage terminal; and
- a sixth NMOS transistor, coupled between the drain of the fifth NMOS transistor and the bit bar line, having a gate coupled to the word line.

14. A memory output circuit, capable of receiving bit line data and bit bar line data output by a memory cell array, comprising:
- a pre-charge circuit, coupled between a first voltage terminal, a first node, and a first inverse node, capable of pre-charging the first node and the first inverse node, wherein the bit line data and bit bar line data are respectively output to the first node and the first inverse node;
- a source follower circuit, coupled between the first node, the first inverse node, a second node, and a second inverse node, capable of receiving a first voltage on the first node and a first inverse voltage on the first inverse node;
- a half latch circuit, coupled between the first voltage terminal, the second node, and the second inverse node, capable of generating a second voltage on the second node and a second inverse voltage on the second inverse node according to the first voltage and the first inverse voltage; and
- a sense amplifier, capable of detecting the second voltage on the second node and the second inverse voltage on the second inverse node to generate a third voltage on a third node and a third inverse voltage on a third inverse node.

15. The memory output circuit as claimed in claim 14, wherein the memory output circuit further comprises:
- a dynamic loading circuit, capable of charging the second node to a logic high voltage when the first voltage on the first node is greater than a threshold voltage, and charging the second inverse node to the logic high voltage when the first inverse voltage on the first inverse node is greater than the threshold voltage.

16. The memory output circuit as claimed in claim 14, wherein the pre-charge circuit comprises:
- a first PMOS transistor, coupled between the first voltage terminal and the first node, having a gate coupled to the output trigger voltage; and
- a second PMOS transistor, coupled between the first voltage terminal and the first inverse node, having a gate coupled to the output trigger voltage.

17. The memory output circuit as claimed in claim 14, wherein the source follower circuit comprises:
- a first NMOS transistor, coupled between the first node and the second node, having a gate coupled to the output trigger voltage;
- a second NMOS transistor, coupled between the first inverse node and the second inverse node, having a gate coupled to an output trigger voltage; and
- a PMOS transistor, coupled between the second inverse node and the second node, having a gate coupled to the output trigger voltage.

18. The memory output circuit as claimed in claim 14, wherein the half latch circuit comprises:
- a first PMOS transistor, coupled between the first voltage terminal and the second node, having a gate coupled to the second inverse node; and
- a second PMOS transistor, coupled between the first voltage terminal and the second inverse node, having a gate coupled to the second node.

19. The memory output circuit as claimed in claim 15, wherein the dynamic loading circuit comprises:
- a first PMOS, coupled between a first voltage terminal and the second node, having a gate coupled to a first inverting voltage; and
- a second PMOS, coupled between the first voltage terminal and the second inverse node, having a gate coupled to a second inverting voltage;
- wherein the first inverting voltage is obtained by inverting the first voltage, and the second inverting voltage is obtained by inverting the first inverse voltage.

20. The memory output circuit as claimed in claim 14, wherein the sense amplifier circuit comprises:
- a first NMOS transistor, having a gate coupled to a sense enable signal, and a source coupled to a second voltage terminal;
- a second NMOS transistor, coupled between the third inverse node and the drain of the first NMOS transistor, having a gate coupled to the second node;

a third NMOS transistor, coupled between the third node and the drain of the first NMOS transistor, having a gate coupled to the second inverse node;

a first PMOS transistor, coupled between a first voltage terminal and the third inverse node, having a gate coupled to the third node;

a second PMOS transistor, coupled between the first voltage terminal and the third node, having a gate coupled to the third inverse node;

a third PMOS transistor, coupled between the first voltage terminal and the third inverse node, having a gate coupled to the sense enable signal; and a fourth PMOS transistor, coupled between the first voltage terminal and the third node, having a gate coupled to the sense enable signal.

* * * * *